United States Patent [19]

Sanso

[11] Patent Number: 5,856,636
[45] Date of Patent: Jan. 5, 1999

[54] ELECTRONIC CIRCUIT PROTOTYPE WIRING BOARD WITH VISUALLY DISTINCTIVE CONTACT PADS

[76] Inventor: David W. Sanso, 6598 W. Oregon Ave., Lakewood, Colo. 80226

[21] Appl. No.: 810,356

[22] Filed: Mar. 3, 1997

[51] Int. Cl.⁶ .................................................. H05K 1/03
[52] U.S. Cl. ............................ 174/255; 29/830; 361/748
[58] Field of Search .................................. 174/255, 260, 174/261, 267; 361/748, 791, 792, 793, 794, 795, 774, 744, 780; 158/537, 158.1; 29/830, 852, 853

[56] References Cited

U.S. PATENT DOCUMENTS

| | | | |
|---|---|---|---|
| 3,257,717 | 6/1966 | Wilkinson et al. | 29/825 |
| 4,562,513 | 12/1985 | Arnold et al. | 361/777 |
| 4,959,008 | 9/1990 | Wasulko | 428/40 |
| 5,001,605 | 3/1991 | Savagian et al. | 361/792 |
| 5,286,926 | 2/1994 | Kimura et al. | 174/250 |
| 5,363,280 | 11/1994 | Chobot et al. | 361/794 |
| 5,461,202 | 10/1995 | Sera et al. | 174/254 |
| 5,468,917 | 11/1995 | Brodsky et al. | 174/255 |
| 5,512,712 | 4/1996 | Iwata et al. | 174/258 |
| 5,570,504 | 11/1996 | DiSefano et al. | 29/830 |
| 5,627,730 | 5/1997 | Konig et al. | 361/784 |

*Primary Examiner*—Bot L. Ledynh
*Assistant Examiner*—Kristina Soderquist
*Attorney, Agent, or Firm*—J. Preston Oxenham

[57] ABSTRACT

Electronic circuit prototype wiring board is fabricated with layers of electrically conductive material separated by layers of dielectric material. Contact pads of electrically conductive material are arrayed on a surface of the board. Columns of electrically conductive material extend upward from each of the conductive layers to selected contact pads, passing through perforations in any intermediate layers above, such that each of the pads is in electrical communication with only one of the conductive layers. All of the pads connected to a common conductive layer are of a similar geometric plan form which is associated with that layer and which is different and distinguishable from the plan form of pads in electrical communication with any other of the conductive layers. In an alternative embodiment, the wiring board is fabricated of an elastic dielectric material. Access points for each conductive layer of the board are identified by similar geometric shapes associated with that layer and which are different and distinguishable from shapes identifying access points for any other of the conductive layers. Pins fabricated of electrically conductive material are inserted into the elastic dielectric material to establish electrical contact with a desired conductive layer and be retained by the dielectric material to serve as a wiring post.

11 Claims, 5 Drawing Sheets

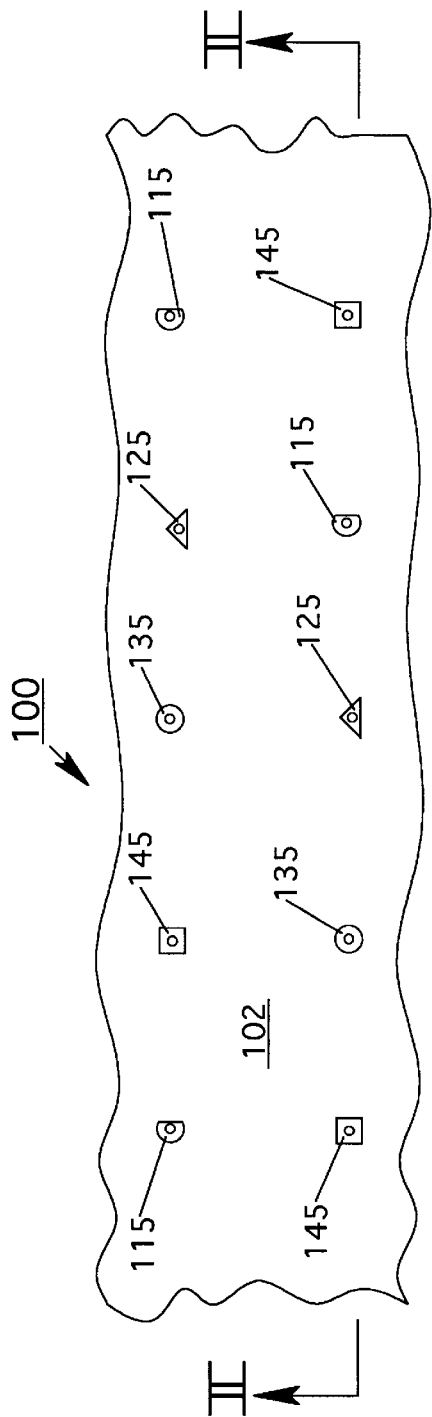
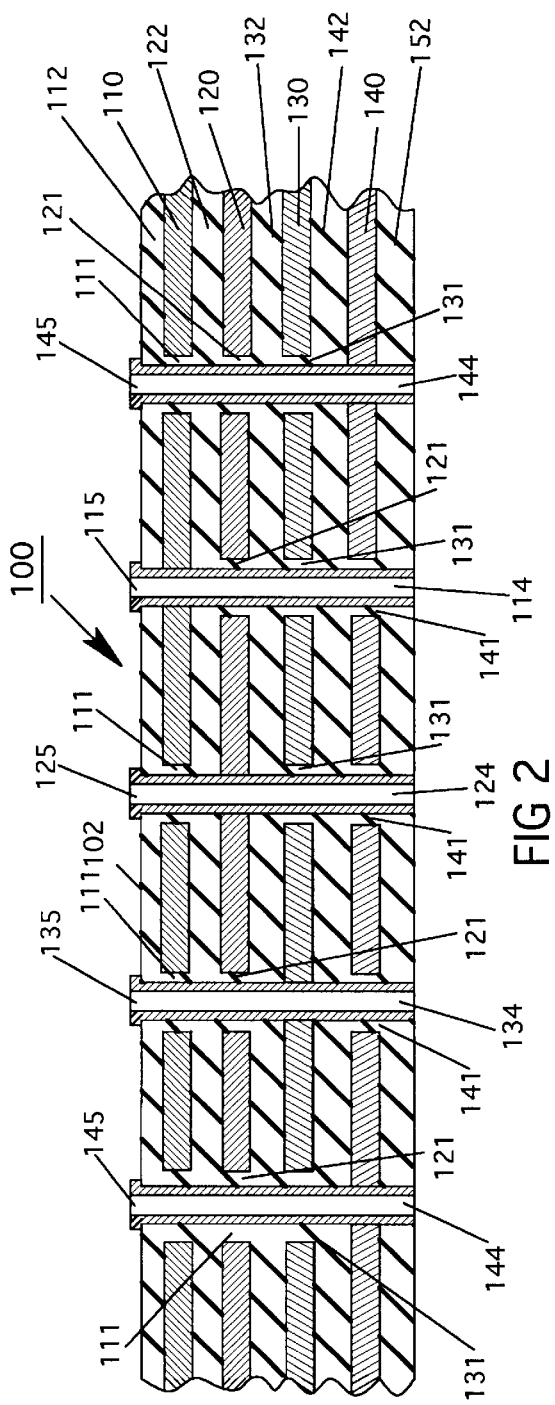

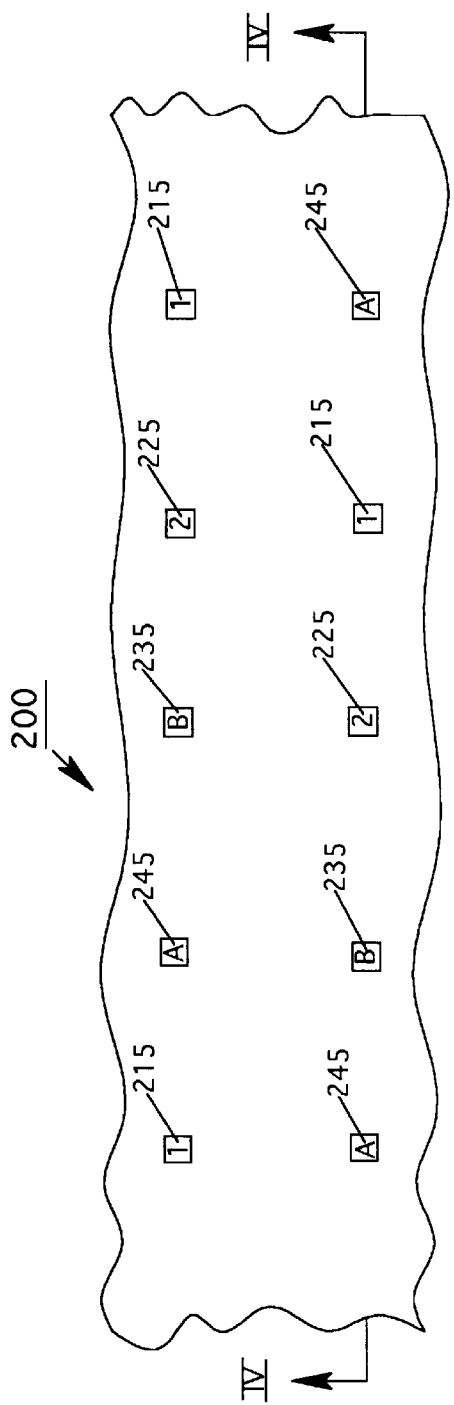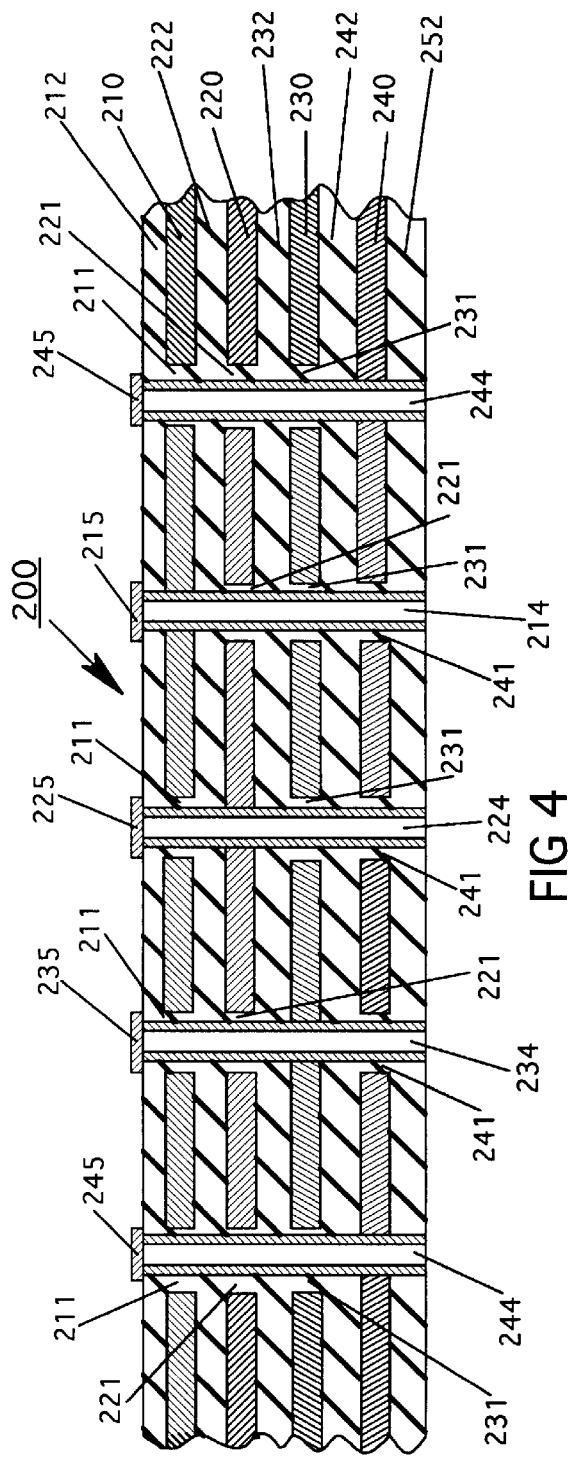

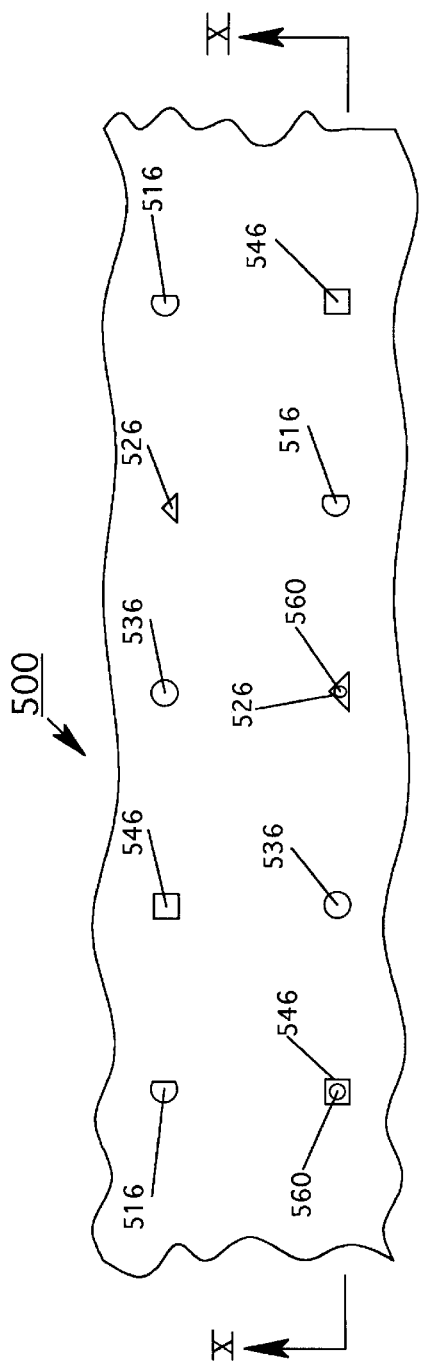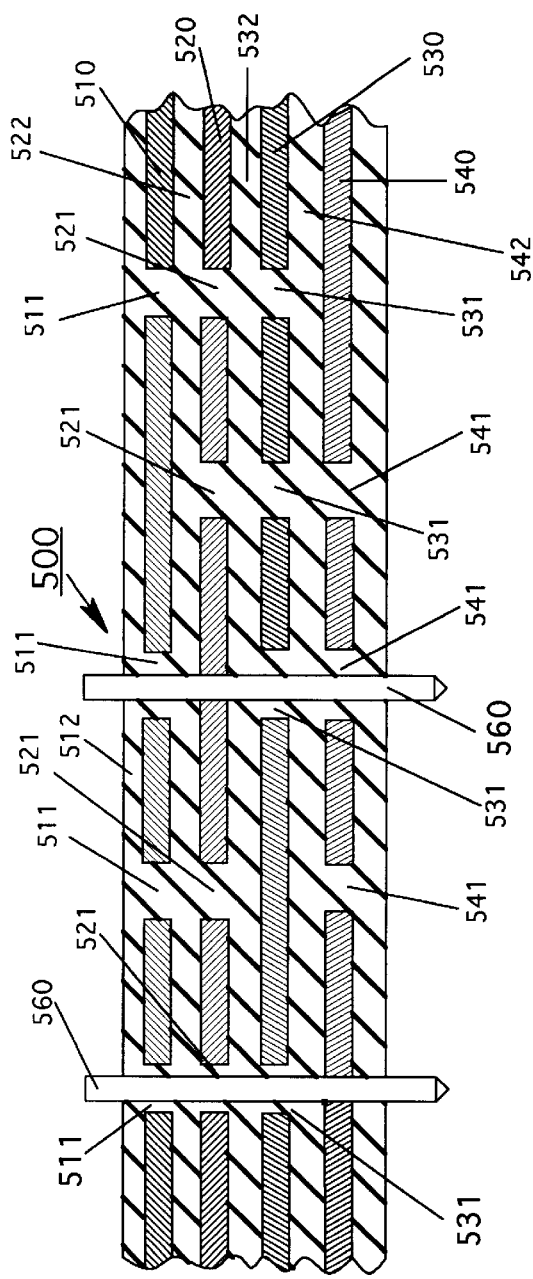

ELECTRONIC CIRCUIT PROTOTYPE WIRING BOARD WITH VISUALLY DISTINCTIVE CONTACT PADS

TECHNICAL FIELD

The present invention relates to wiring boards used to construct prototype electronic circuits. More particularly, the present invention relates to such wiring boards which include a plurality of layers of electrically conductive material separated by dielectric material. Most particularly, the present invention relates to such electronic circuit prototype wiring boards which include a ground potential plane of electrically conductive material and one or more additional, generally constant potential planes of electrically conductive material.

BACKGROUND OF THE INVENTION

In the course of developing an electronic product, once an initial design for an electronic circuit is settled upon, a precise and detailed listing of each element of the circuit is completed and a proposed layout of a printed circuit board upon which to assemble the elements is developed. The printed circuit board is then fabricated and a first prototype of the proposed circuit is assembled and tested. Typically, the circuit design is then refined through an iterative process as more is learned about the circuit's behavior. During this iterative process, a succession of printed circuit board designs must be fabricated and circuits assembled as the design evolves. Assembly of each of the successive test circuits can be very time consuming; the assembly of a complex circuit may require weeks of technician time. Thus, there is a need for a quick and accurate way to test circuits without going through the process of repeatedly laying out and fabricating printed circuit boards.

Attempts have been made to develop circuit prototype wiring systems, and a number of prototype wiring systems have become available. Perhaps the simplest of these systems is a push-in board system which allows certain electronic components to be connected without soldering by pressing them into commonly connected retentive sockets. While this system allows quick and easy assembly of a prototype circuit, except in the case of very simple circuits, it may not provide a reliable representation of how a circuit will preform once laid out on a printed circuit board. The failure of this system to reliably predict performance in the case of more complex circuits results from the system's inability to properly model nodes as they will occur in a circuit under various frequency and current conditions once the circuit is assembled on a printed circuit board.

Another prototype wiring system of the prior art allows components to be soldered to a pre-built printed circuit board such that the components can then be connected with wires. While this system provides better circuit performance than the push-in type system, it is, none the less, awkward and does not provide a reliable prediction of the performance to be expected from a circuit when mounted on the printed circuit board in its final configuration.

As the frequency at which a circuit operates is increased, performance of the circuit becomes increasingly affected by electronic components in its environment, including components of the circuit itself, components connected to the circuit, and components completely independent of the circuit. This relational effect becomes very substantial in the case of circuits, such as those of microprocessor devices of the present art, which operate at high clock speeds. When designing printed circuit boards for such applications, the relational effect may be minimized by including a special conductive layer, generally referred to as a "ground plane layer" or "power plane layer", within the board. Such ground plane layers allow circuit designers to control the interaction of ground nodes in the circuit.

Current level also has an effect on ground nodes. In the design of circuits for relatively high power applications, such as those associated with power supplies and motor drives, it is absolutely necessary to provide a ground plane layer. Further, in many cases, it is necessary to provide multiple ground plane layers in the design of such circuits.

Thus, to allow proper modeling and reliable prediction of the performance of the final production version of printed circuit board mounted circuits for high power and high frequency applications, it is necessary that a prototype wiring system be capable of providing one or more ground plane layers for a prototype circuit. The push-in type prototype wiring system discussed above has no such provision for a ground plane and thus can not be used to model circuits other than very low frequency and low power circuits.

DISCLOSURE OF THE INVENTION

It is an object of the present invention to provide an electronic circuit prototype wiring board which can allow one or more ground plane layers to be provided in a prototype electronic circuit.

It is an object of the present invention to provide an electronic circuit prototype wiring board which can allow one or more ground plane layers and one or more power plane layers to be provided in an electronic prototype circuit.

It is a further object of the present invention to provide an electronic circuit prototype wiring board which allows prototype electronic circuits to be quickly and easily assembled.

It is yet a further an object of the present invention to provide an electronic circuit prototype wiring board which allows reliable prediction of the performance of high frequency electronic circuits when assembled in final configuration on a printed circuit board.

It is also an object of the present invention to provide an electronic circuit prototype wiring board which allows reliable prediction of the performance of high power electronic circuits when assembled in final configuration on a printed circuit board.

It is a further object of the present invention to provide an electronic circuit prototype wiring board which allows reliable prediction of the performance of electronic circuits which are to be operated at high power and high frequency when assembled in final configuration on a printed circuit board.

It is also an object of the present invention to provide an electronic circuit prototype wiring board which is economical to manufacture.

In keeping with the above objectives, an electronic circuit prototype wiring board includes layers of electrically conductive material separated by layers of dielectric material, in a sandwiched manner, with an outer layer of dielectric material on an upper surface. Contact pads of electrically conductive material are arrayed on the upper surface. Columns of electrically conductive material extend upward from each of the conductive layers to selected contact pads, passing through perforations in any intermediate layers above, such that each of the pads is in electrical communication with only one of the conductive layers of the prototype wiring board. All of the pads in electrical communication with a given conductive layer are of a similar geometric plan form which is associated with that layer and which is different and distinguishable from the plan form of pads in electrical communication with any other of the conductive layers. Thus, the layer with which a given pad is in electrical communication may be determined by observation of its shape; pads which are in electrical communication with a common layer and, consequently, in electrical communication with one another, may be determined by observation of their similar shapes. A prototype circuit may be assembled at the surface of the board, at least in part, by placing appropriate circuit elements in electrical communication with appropriate pads. Further, by appropriate selection of pads, ground and/or power planes for the circuit may be provided.

In an alternative embodiment, the wiring board is fabricated utilizing an elastic dielectric material. Access points for each conductive layer of the board are identified by similar geometric shapes associated with that layer and which are different and distinguishable from shapes identifying access points for any other of the conductive layers. A pin fabricated of electrically conductive material may be inserted into the elastic dielectric material at a chosen access point to establish electrical contact with a desired conductive layer and to be retained by the dielectric material to serve as a wiring post for access to the chosen conductive layer.

Other objects, advantages and aspects of the invention will become apparent upon perusal of the following detailed description and claims and upon reference to the accompanying drawings.

BRIEF DESCRIPTION OF THE DRAWINGS

FIG. 1 is a partial plan view of an electronic circuit prototype wiring board comprising a preferred embodiment of the present invention.

FIG. 2 is a partial sectional view of the wiring board of FIG. 1 taken II—II.

FIG. 3 is a partial plan view of an electronic circuit prototype wiring board comprising an alternative embodiment of the present invention.

FIG. 4 is a partial sectional view of the wiring board of FIG. 3 taken at IV—IV.

FIG. 9 is a partial plan view of an electronic circuit prototype wiring board comprising an alternative embodiment of the present invention.

FIG. 10 is a partial sectional view of the wiring board of FIG. 9 taken at X—X.

DETAILED DESCRIPTION

Figure 5:
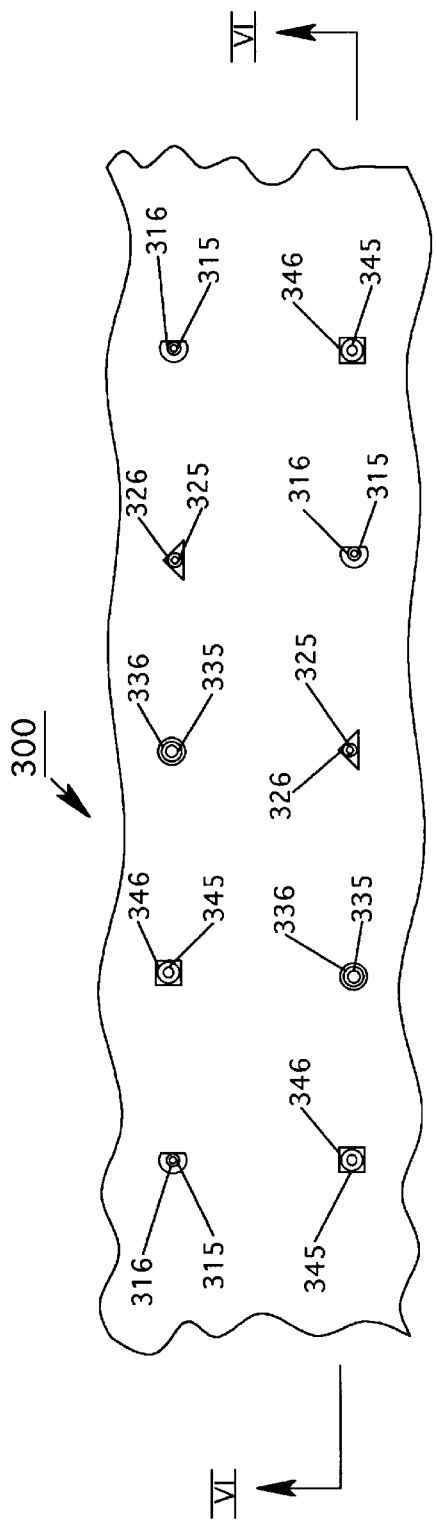
FIG. 5 is a partial plan view of an electronic circuit prototype wiring board comprising an alternative embodiment of the present invention.

Exemplary electronic circuit prototype wiring board 100 comprising a preferred embodiment of the present invention is shown in the partial plan view of FIG. 1 and in the partial section view of FIG. 2, which is taken at II—II of FIG. 1. As may best be seen in FIG. 2, wiring board 100 includes electrically conductive layers 110, 120, 130, and 140. Electrically conductive layer 110 is overlaid by insulating layer 112 of dielectric material and each of electrically conductive layers 120, 130, and 140 is insulated from the layer above by insulating layers 122, 132, and 142 of dielectric material, respectively. Conductive layer 140 of exemplary board 100 is also underlaid by insulating layer 152 of dielectric material at the bottom of board 100.

Electrically conductive columns, also referred to as vias, 144 are in electrical communication with conductive layer 140 and extend upward from conductive layer 140 to square, electrically conductive pads 145 on upper surface 102 of wiring board 100. Each of columns 144 pass through perforations 131, 121, and 111 formed in conductive layers 130, 120, and 110, respectively, such that columns 144 are not in electrical communication with conductive layer 130, 120, or 110. Thus, square, electrically conductive pads 145 are in electrical communication only with one of the conductive layers, conductive layer 140. Columns 144 and square pads 145 shown are typical of additional columns 144 and square pads 145 providing electronic access to conductive layer 140, but which are not shown in the partial views of FIGS. 1 and 2.

Electrically conductive columns 134 are in electrical communication with conductive layer 130 and extend upward from conductive layer 130 to circular, electrically conductive pads 135 on upper surface 102 of wiring board 100. Columns 134 pass through perforations 141, 121, and 111 formed in conductive layers 140, 120, and 110, respectively, such that columns 134 are not in electrical communication with conductive layers 140, 120, or 110. Thus, circular, electrically conductive pads 135 are in electrical communication only with one of the conductive layers, conductive layer 130. Columns 134 and circular pads 135 shown are typical of additional columns 134 and circular pads 135 providing electronic access to conductive layer 130, but which are not shown in the partial views of FIGS. 1 and 2.

Electrically conductive columns 124 are in electrical communication with conductive layer 120 and extend upward from conductive layer 120 to triangular, electrically conductive pads 125 on upper surface 102 of wiring board 100. Columns 124 pass through perforations 141, 131, and 111 formed in conductive layers 140, 130, and 110, respectively, such that columns 124 are not in electrical communication with conductive layers 140, 130, or 110. Thus, electrically conductive triangular pads 125 are in electrical communication only with one of the conductive layers, conductive layer 120. Columns 124 and triangular pads 125 shown are typical of additional columns 124 and triangular pads 125 providing electronic access to conductive layer 120, but which are not shown in the partial views of FIGS. 1 and 2.

Electrically conductive columns 114 are in electrical communication with conductive layer 110 and extend upward from conductive layer 110 to semicircular, electrically conductive pads 115 on upper surface 102 of wiring board 100. Columns 114 pass through perforations 141, 131, and 121 formed in conductive layers 140, 130, and 120, respectively, such that columns 114 are not in electrical communication with conductive layers 140, 130, or 120. Thus, electrically conductive semicircular pads 114 are in electrical communication only with one of the conductive layers, conductive layer 110. Columns 114 and semicircular pads 115 shown are typical of additional columns 114 and semicircular pads 115 providing electronic access to conductive layer 110, but which are not shown in the partial views of FIGS. 1 and 2.

Thus, all square pads 145 on the upper surface of wiring board 100 are in electrical communication with layer 140 and only layer 140, and, by their mutual communication with layer 140, each of square pads 145 is in electrical communication with each of the other square pads 145. A similar relation exists for circular pads 135, triangular pads 125 and semicircular pads 115 and layers 130, 120 and 110 respectively. The layer with which a given pad is in electrical communication may be determined by observation of its shape; pads which are in electrical communication with a common layer and, consequently, in electrical communication with one another, may be determined by observation of their similar shapes. A prototype circuit may be assembled at the surface of the board, at least in part, by placing appropriate circuit elements in electrical communication with appropriate pads. Further, by appropriate selection of pads, any of layers 110, 120, 130 and 140 may be utilized as a ground or power plane for the circuit.

Wiring board 100 of FIGS. 1 and 2 may be fabricated in a manner well known to those familiar with the art by plating and then etching the conductive layers on sheets of dielectric material, laminating the sheets of dielectric together, drilling through the laminated dielectric sheets at appropriate locations and then plating the interior of the drilled holes. Wiring boards with a lesser or greater number of conductive layers may be fabricated in the same manner. Conductive pads may be placed in any desired pattern on the board surface by appropriate etching of the conductive layers and drilling of the holes in the laminated board.

Exemplary electronic circuit prototype wiring board 200 comprising an alternative embodiment of the present invention is shown in the partial plan view of FIG. 3 and in the partial section view of FIG. 4, which is taken at IV—IV of FIG. 3. Elements of wiring board 200 which are similar to those of wiring board 100 are similarly numbered. Wiring board 200 is fabricated in a manner similar to wiring board 100 except that conductive pads 215, 225, 235, and 245 are fabricated of foil type material and attached to columns 214, 224, 234 and 244 and the surface of wiring board 200 after columns 214, 224, 234 and 244 are plated or inserted into place. Pads 245 of wiring board 200 providing electrical access to layer 240 are marked with the letter "A". Pads 235 of wiring board 200 providing electrical access to layer 230 are marked with the letter "B". Pads 225 of wiring board 200 providing electrical access to layer 220 are marked with the numeral "2". And, pads 215 providing electrical access to layer 210 are marked with the numeral "1".

Figure 6:
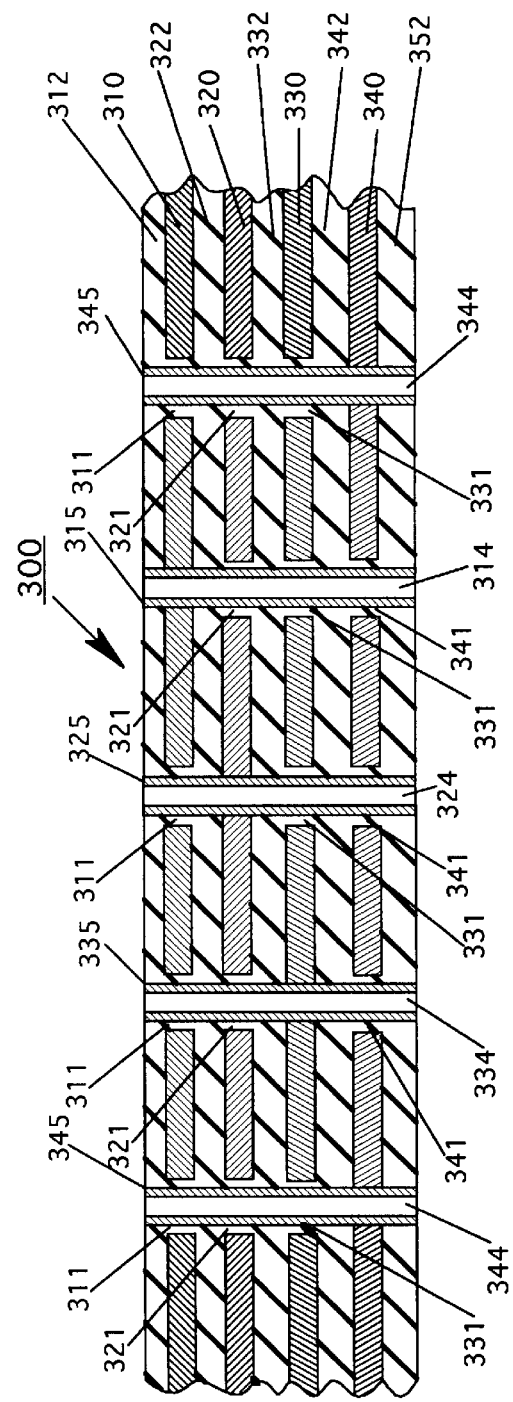
FIG. 6 is a partial sectional view of the wiring board of FIG. 5 taken at VI—VI.

Exemplary electronic circuit prototype wiring board 300 comprising another alternative embodiment of the present invention is shown in the partial plan view of FIG. 5 and in the partial section view of FIG. 6, which is taken at VI—VI of FIG. 5. Elements of wiring board 300 which are similar to those of wiring board 100 are similarly numbered. Wiring board 300 is fabricated in a manner similar to wiring board 100 except that conductive pads 315, 325, 335, and 345 are merely the ends of columns 314, 324, 334 and 344. Pads 345 of wiring board 300 providing electrical access to layer 340 are surrounded by square field 346 printed on surface 302 of wiring board 300. Pads 335 if wiring board 300 providing electrical access to layer 330 are surrounded by circular printed fields 336. Pads 325 of wiring board 300 providing electrical access to layer 320 are surrounded by triangular printed fields 326. And, pads 315 of wiring board 300 providing electrical access to layer 310 are surrounded by half-circle printed field 316.

Figure 7:
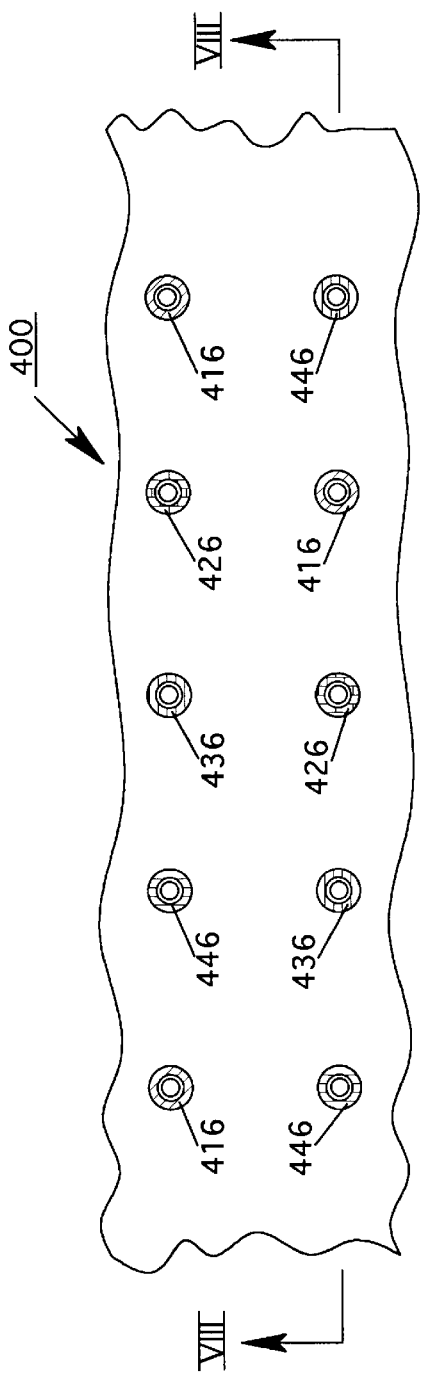
FIG. 7 is a partial plan view of an electronic circuit prototype wiring board comprising an alternative embodiment of the present invention
Figure 8:
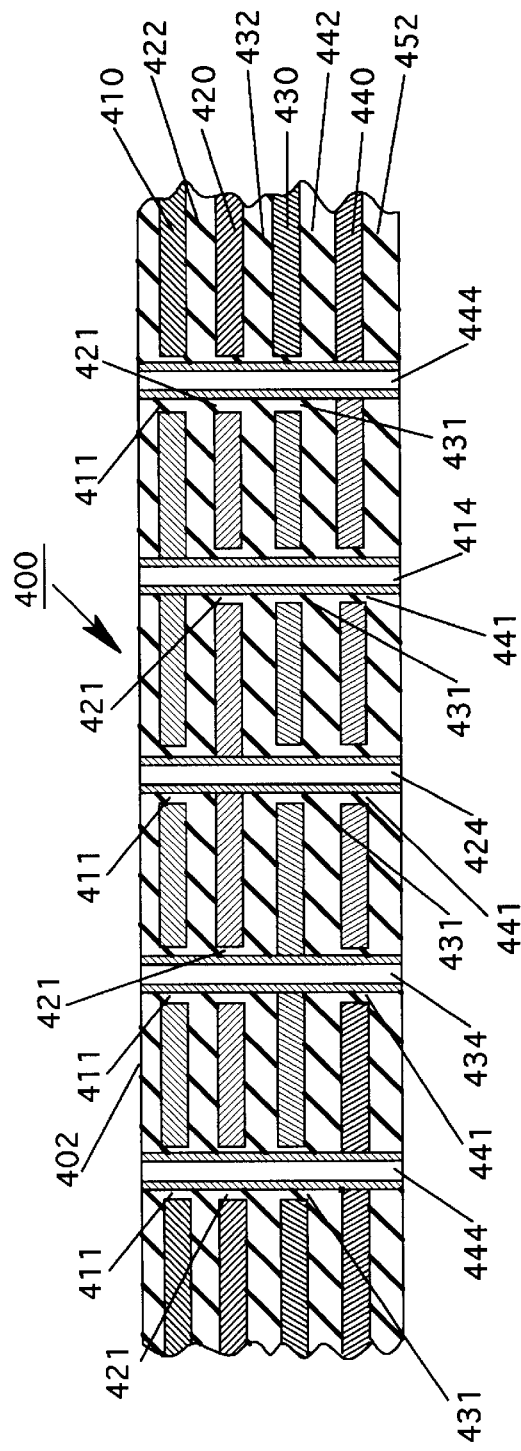
FIG. 8 is a partial sectional view of the wiring board of FIG. 7 taken at VIII—VIII.

Exemplary electronic circuit prototype wiring board 400 comprising another alternative embodiment of the present invention is shown in the partial plan view of FIG. 7 and in the partial section view of FIG. 8, which is taken at VIII—VIII of FIG. 7. Elements of wiring board 400 which are similar to those of wiring board 100 are similarly numbered. Wiring board 400 is fabricated in a manner similar to wiring board 100 except that conductive pads 415, 425, 435, and 445 are merely the ends of columns 414, 424, 434 and 444. Pads 445 of wiring board 400 providing electrical access to layer 440 are surrounded by red colored fields 446 printed on surface 402 of wiring board 400 Pads 435 of wiring board 400 providing electrical access to layer 430 are surrounded by blue printed fields 436. Pads 425 of wiring board 400 providing electrical access to layer 420 are surrounded by yellow printed fields 426. And, pads 415 of wiring board 400 providing electrical access to layer 410 are surrounded by green printed field 416.

Exemplary electronic circuit prototype wiring board 500 comprising another alternative embodiment of the present invention is shown in the partial plan view of FIG. 9 and in the partial section view of FIG. 10, which is taken at X—X of FIG. 9. Elements of wiring board 500 which are similar to those of wiring board 100 are similarly numbered. Wiring board 500 is fabricated in a manner similar to wiring board 100 and includes perforated electrically conductive layers 510, 520, 530 and 540. Points on surface 502 of wiring board 500 providing electrical access to layer 540 are identified by square field 546 printed on surface 502. Points on surface 502 of wiring board 500 providing electrical access to layer 530 are identified by circular printed fields 536. Points on surface 502 of wiring board 500 providing electrical access to layer 520 are identified by triangular printed fields 526. And, points on surface 502 of wiring board 500 providing electrical access to layer 510 are identified by semicircular printed fields 516. Wiring board 500 is fabricated utilizing an elastic dielectric material into which pins 560 may be pressed at selected access points to establish electrical communication with a appropriate conductive layer and to be retained by the dielectric material of wiring board 500 and serve as a wiring post.

While exemplary electronic prototype wiring boards comprising embodiments of the present invention have been shown, it will be understood, of course, that the invention is not limited to those embodiments. Modification may be made by those skilled in the art, particularly in light of the foregoing teachings. For example, attachment devices for attaching wires or circuit elements to the surface pads may be provided, and further, the pads associated with conductive layers may be distinguished by the type or shape of the attachment device. Also, conductive pads may be placed at the bottom as well as at the top of the conductive columns to provide two surfaces from which conductive layers may be accessed. Further, a wiring board comprising an embodiment of the present invention can be fabricated in a cylindrical, spherical or other configuration. It is, therefore, contemplated by the appended claims to cover any such modification which incorporates the essential features of this invention or which encompasses the spirit and scope of the invention.

I claim:

1. A wiring board for wiring prototype electronic circuits comprising:

a first layer of electrically conductive material;

a second layer of electrically conductive material;

a first layer of dielectric material overlying said first conductive layer;

a second layer of dielectric material lying between said first conductive layer and said second conductive layer;

first electrically conductive pads each of said first pads associated with a common first geometric shape;

first electrically conductive vias providing electrical communication between each of said first pads and said first conductive layer but not said second conductive layer;

second electrically conductive pads each of said second pads associated with a common second geometric shape, said second geometric shape visually distinguishable from said first geometric shape; and, second electrically conductive vias providing electrical communication between each of said second pads and said second conductive layer but not said first conductive layer.

2. A wiring board for wiring prototype electronic circuits as in claim 1 in which each of said first pads has a plan form of said first geometric shape and each of said second pads has a plan form of said second geometric shape.

3. A wiring board for wiring prototype electronic circuits as in claim 1 further comprising:

an external surface of dielectric material, said surface having a general external color and areas of contrasting color and of said first shape associated with said each of said first pads and areas of contrasting color and of said second shape associated with said each of said second pads.

4. A wiring board for wiring prototype electronic circuits as in claim 3 in which one of said first or second plurality of vias includes an electrically conductive pin pressed into said surface.

5. A wiring board for wiring prototype electronic circuits as in claim 3 in which said first and second shapes surround said first and second pads, respectively.

6. A wiring board for wiring prototype electronic circuits as in claim 1 in which said first and second shapes are adjacent to said first and second pads, respectively.

7. A wiring board for wiring prototype electronic circuits as in claim 1 in which said shapes are formed on a surface of said pads.

8. A wiring board for wiring prototype electronic circuits as in claim 1, further comprising:

said first conductive layer is perforated and said second vias include a column which passes through a perforation in said first layer.

9. A wiring board for wiring prototype electronic circuits as in claim 1, further comprising:

said first and second electrically conductive vias are plated holes defined by said layers of dielectric material.

10. A wiring board for wiring prototype electronic circuits comprising:

a first layer of electrically conductive material;

a second layer of electrically conductive material;

a plurality of first electrically conductive pads, each of said first pads associated with a common first color;

first electrically conductive via providing electrical communication between each of said first pads and said first conductive layer but not said second conductive layer;

a plurality of second electrically conductive pads, each of said second pads associated with a common second color, said second color visually distinguishable from said first color; and, second electrically conductive vias providing electrical communication between each of said second pads and said second conductive layer but not said first conductive layer.

11. A wiring board for wiring prototype electronic circuits as in 10 in which said first and second colors define a geometric shape surrounding said first and second locations, respectively.

* * * * *